(12) United States Patent
Gaidis et al.

(10) Patent No.: US 6,812,141 B1
(45) Date of Patent: Nov. 2, 2004

(54) RECESSED METAL LINES FOR PROTECTIVE ENCLOSURE IN INTEGRATED CIRCUITS

(75) Inventors: Michael C. Gaidis, Wappingers Falls, NY (US); Joachim Nuetzel, Fishkill, NY (US); Walter Glashauser, Ringstrasse (DE); Eugene O'Sullivan, Nyack, NY (US); Gregory Costrini, Hopewell Junction, NY (US); Stephen L. Brown, Carmel, NY (US); Frank Findeis, Hopewell Junction, NY (US); Chanro Park, Fishkill, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/610,609

(22) Filed: Jul. 1, 2003

(51) Int. Cl.[7] .......................................... H01L 21/4763
(52) U.S. Cl. ..................................... 438/637; 438/745
(58) Field of Search ................................. 438/618, 623, 438/624, 631, 637, 745, 786, 725

(56) References Cited

U.S. PATENT DOCUMENTS 6,294,456 B1 * 9/2001 Lee et al. .................... 438/623
6,576,545 B1 * 6/2003 Hopper et al. .............. 438/624

* cited by examiner

Primary Examiner—Phuc T. Dang
(74) Attorney, Agent, or Firm—Slater & Matsil, L.L.P.

(57) ABSTRACT

Encapsulating areas of metallization in a liner material, such as Tantalum, Tantalum Nitride, Silicon Carbide allows aggressive or harsh processing steps to be used. These aggresive processing steps offer the possibility of fabricating new device architectures. In addition, by encapsulating the areas of metallization, metal ion migration and electromigration can be prevented. Further, the encapsulated areas of metallization can serve as a self-aligning etch mask. Thus, vias etched between adjacent areas of metallization allow the area of the substrate allocated to the via to be significantly reduced without increasing the possibility of electrical shorts to the adjacent areas of metallization.

32 Claims, 6 Drawing Sheets

RECESSED METAL LINES FOR PROTECTIVE ENCLOSURE IN INTEGRATED CIRCUITS

TECHNICAL FIELD

The present invention relates generally to the manufacture of semiconductor devices and more particularly to a method of encasing areas of metallization to produce an intermediate structure that allows aggressive processing steps, prevents metal ion migration or electromigration, and increases packing density by using the encased areas of metallization as a self-aligned mask for etching cavities such as trenches or vias from an upper level of metallization through an intermediate dielectric to lower level circuits or metallization. The encapsulation and planarization after encapsulation provides a smoother surface for subsequent processing and enables the use of more effective and/or aggressive processing techniques such as chlorine-based RIE (Reactive Ion Etching) and consequently enables the creation of new device architectures.

BACKGROUND

As will be appreciated by those skilled in the art, most presently-used integrated circuit processing includes polishing of Damascene deposited copper or tungsten metal lines and vias. The resultant exposed copper or tungsten lines and vias are particularly susceptible to corrosion resulting from subsequent processing steps. Consequently, many of the more effective processing steps are simply too harsh to be used with such exposed copper or tungsten lines. Such limits on the available etching techniques and other processing requires costly modifications to a less expensive process flow that might otherwise be used. Therefore, it would be advantageous if the more effective, yet harsher, processing steps could be used on substrates containing copper or tungsten Damascene type integrated structures.

The present invention not only allows the use of very harsh processing steps, including chlorine-based etching steps, to be used with a copper or tungsten Damascene structures, but also controls out-diffusion or migration of harmful metal ions and atoms to adjacent sensitive circuits and may be used to provide a self-aligning mask for increasing the packing density of devices on a semiconductor chip.

For example, as will be appreciated by those skilled in the art, most semiconductor devices have several layers of circuits interconnected by vias etched through insulating and/or dielectric materials separating the two levels of circuits and filled with a conductive material such as, for example only, copper or tungsten. To avoid electrical shorts, it is very important that these vias filled with conductive metals do not unintentionally come into contact with other conductive lines and/or devices. Since electrical circuits and devices in an integrated chip are very small, a via that does successfully connect two levels of circuits together, but is misaligned by only a few tenths of microns may cause shorts and render a full wafer of devices useless. As will be appreciated by those skilled in the art, most misaligned vias are the result of a misaligned etching mask. Therefore, it is important that precautions be taken to be sure minor misalignment will not cause shorts. At present, one of the common ways to avoid such destructive electrical shorts is to increase the area that is allocated for the via etch. That is, increase the separation between circuits, or electrical conductive lines, and the location where the via is etched from an upper level to a lower level. This is, of course, a simple and effective solution. Unfortunately, since each of such multi-layer devices will typically include several vias, and since each wafer includes hundreds of devices, increasing the area for each via is also wasteful and decreases yield.

SUMMARY OF THE INVENTION

These and other problems are generally solved or corrected, and technical advantages are generally achieved, by embodiments of the present invention which provides methods and apparatus in a semiconductor structure to enhance further processing of the semiconductor. The methods and apparatus comprise a substrate with a dielectric having a top surface that defines at least one area of metallization having an exposed top surface such as is provided by a typical copper or tungsten Damascene process. For many applications, the area of metallization formed by the Damascene process will also include a protective liner or barrier covering the sides and bottom of the cavity, trench, or via before the copper or other metal is deposited. Suitable materials for the protective liner include, but are not necessarily limited to, Tantalum (Ta), Tantalum Nitride (TaN), Titanium (Ti), Titanium Nitride (TiN), Silicon Nitride (SiN), and Silicon Carbide (SiC). The top surface of the exposed copper or metallization is then recessed by any suitable processing step such as wet etching, RIE (Reactive Ion Etching) with, e.g., CO—NH3 plasma for etching copper, IBE (Ion Beam Etching),or modified CMP (chemical-mechanical polishing). A layer of protective liner material, such as Ta, TaN, Ti, TiN, SiN, or SiC, is then deposited over the recessed top surface of the area of metallization to encase or encapsulate the area of metallization and may be planarized by a CMP (Chemical Mechanical Polish) to provide a very smooth top surface. The planarized encapsulated or protected areas of metallization provide a smoother surface for successive processing steps and also allow more aggressive or harsh processing steps. As a first example, a stack of magnetic films can be deposited over the dielectric layer and the protected areas of metallization. The magnetic stack of films can then be pattern etched with a chlorine-based RIE (Reactive Ion Etch), which is simply too corrosive to be used with exposed copper or tungsten lines. According to a second example, two neighboring encased areas of metallization can be used as the mask for etching a via from a top surface through the intermediate layer if the liner and encapsulation encasing the areas of metallization is a dielectric. A conductive metal, such as copper with metal liner, or tungsten, can then be deposited in the via in direct contact with material encasing the lines without short-circuiting the encased areas of metallization. According to a third use, the material encasing the areas of metallization will act as a barrier to migration or electromigration of metal ions or atoms, such as copper for example, into the vicinity of sensitive circuit components. Lastly, the encapsulation of the areas of metallization provides an effective adhesion promoter and protection against oxidation or corrosion so that a wider range of dielectrics can be utilized as films to be deposited on the areas of metallization. For example, one could use silicon oxide directly on the area of metallization without an intermediate silicon nitride layer, and thus reduce significantly the effective dielectric constant and capacitance of the structure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
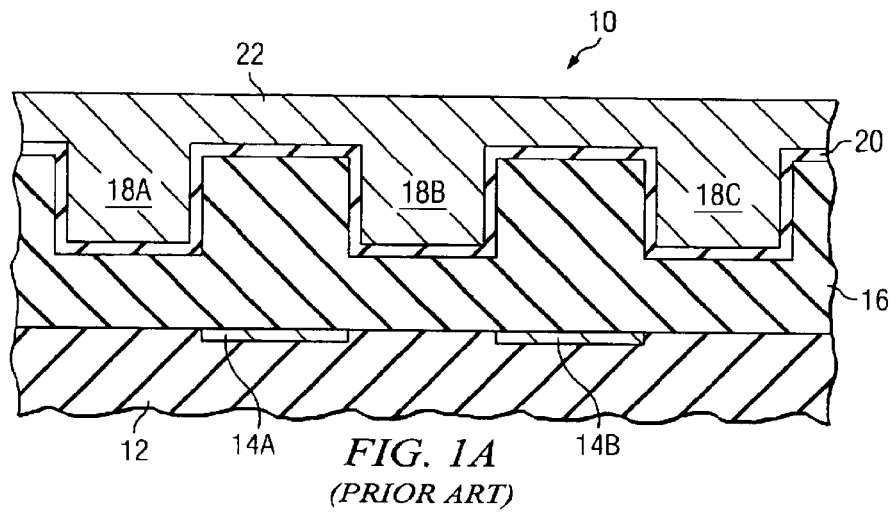
FIGS. 1A–1C illustrate typical prior art steps in providing a metallization level by the Damascene process.

Referring now to the prior art FIG. 1A, there is shown a cross-section of a substrate with areas of metallization (e.g., trenches and/or vias) formed in a dielectric. Typically, the areas of metallization will be formed by the Damascene process but could be formed by any other suitable technique. As shown, a substrate 10 is comprised of a first level of dielectric 12 which may include a multiplicity of various types of selected circuits. For example, the connecting pads 14a and 14b may represent connections to areas of metallization or terminals of various circuits such as the bit line of memory cells located in dielectric layer 12. Thus, it should be understood that the substrate 10 could represent a single layer of circuits or metallization lines on top of a silicon wafer or, alternatively, the term substrate may be used to represent multiple layers of interconnecting circuits. In any event, there is shown a layer of dielectric material 16 defining a multiplicity of trenches 18a, 18b and 18c etched therein. The sidewalls and bottom of the trenches as well as the top surface of dielectric layer 16 are typically covered by a barrier layer or material 20, such as for example, Ta, TaN, Ti, TiN, SiN, or SiC that may be deposited such as by a PVD (plasma vapor deposition) or CVD (chemical vapor deposition) process. After the barrier layer 20 is deposited, a suitable conductive material 22, such as copper, is deposited to fill the trench and cover the top surface of the dielectric layer 16.

Figure 1B:
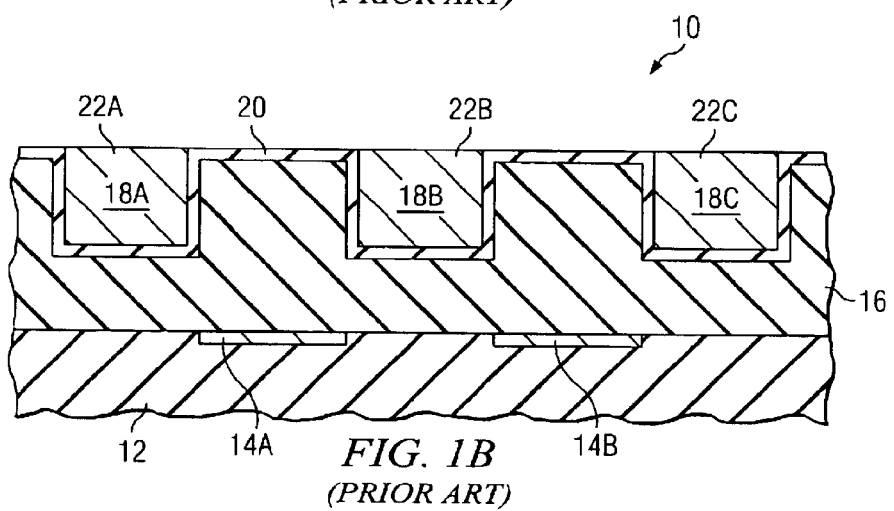
Figure 1C:
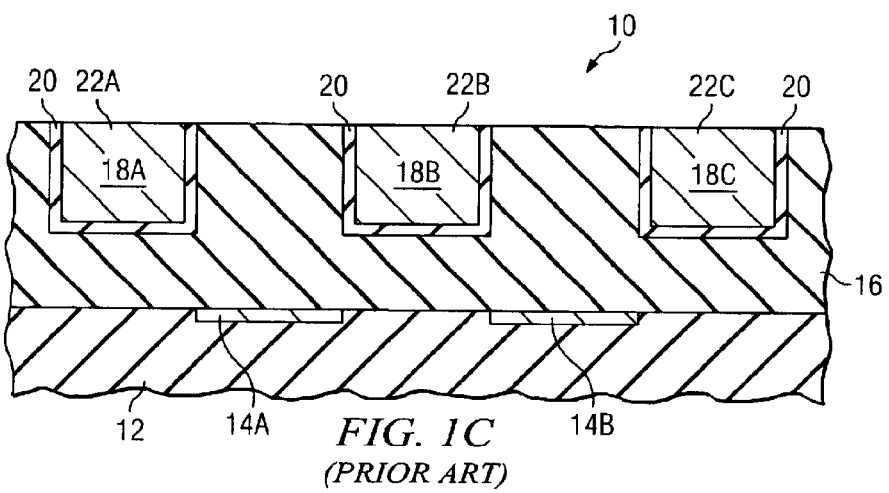

The excess copper or conductive material 22 and those portions of the barrier layer or material 20 covering the top surface of the dielectric material 16 are then removed to obtain the strips of metallization 22a, 22b and 22c defined in the trenches 18a, 18b and 18c lined with barrier material 20 as shown in FIG. 1C. The configuration of FIG. 1C may be achieved, for example, by a two step CMP (chemical-mechanical polishing) process. The first polishing step would use a polishing chemical selective to the material chosen as the barrier layer 20 so as to remove the copper or other metallization down to the barrier layer 20 as shown in FIG. 1B. The second polishing step would then use a chemical selective to the dielectric 16 to remove those portions of the barrier layer or material 20 that are on top of the dielectric 16 so as to result in the structure of FIG. 1C. It will be appreciated by those skilled in the art that to this point, traditional Damascene processing steps have been used.

The use of a barrier layer 20 on the sides and bottom of the trenches, encases the areas of metallization so as to enhance adhesion while preventing the migration of metal atoms or ions, such as for example, copper, into the surrounding dielectric. In addition, as is discussed hereinafter, fully encasing (including the top surface) or encapsulating the metal lines with a material such as Ta, TaN, Ti, TiN, SiN, or SiC protects the metal lines (such as copper or tungsten) so that very harsh or aggressive processing steps or methods can be employed in future steps. The ability to use such aggressive processing, such as for example chlorine-based RIE, will allow the fabrication of new device architectures.

Figure 2A:
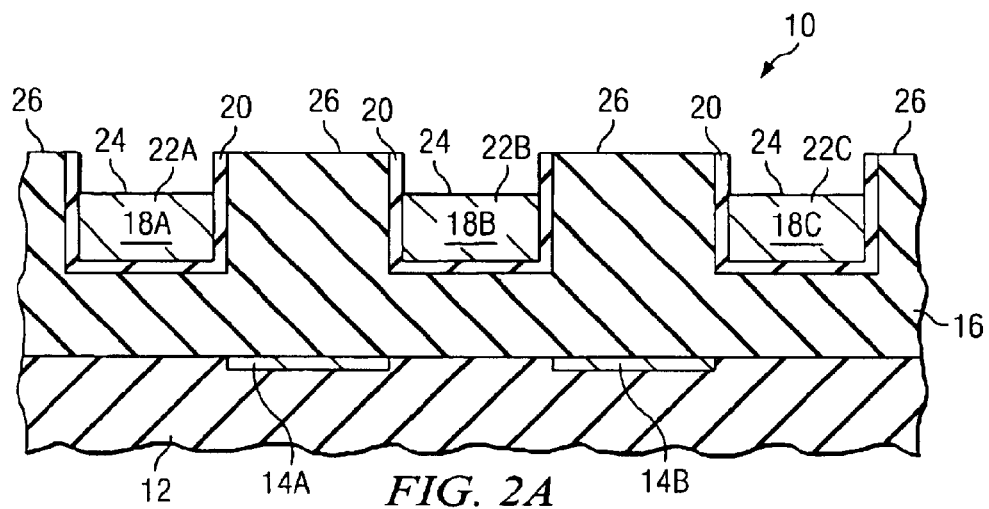
FIGS. 2A–2D illustrate initial processing steps of the present invention to encase areas of metallization according to one embodiment of the invention.
Figure 2B:
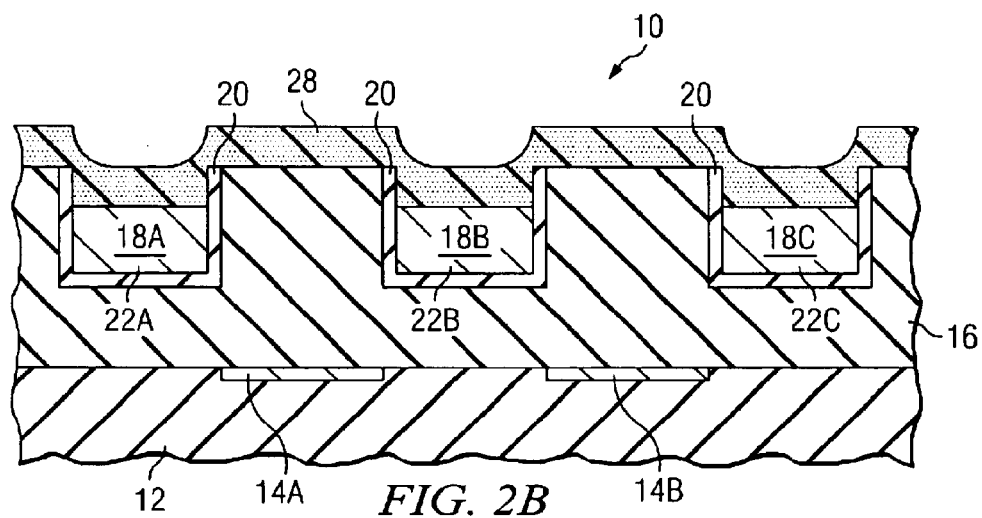

Referring now to FIG. 2A and FIG. 2B, there are described initial processing steps according to one embodiment of the present invention. As shown in FIG. 2A, the surface of the area of metallization 22a, 22b and 22c has been recessed by a process step that is chosen to be selective to the dielectric layer 16, and can also (but not necessarily) be selective to the barrier layer 20. An effective process method for recessing the areas of metallization is to use further CMP in a way that removes the top portion of copper or metallization lines 22a, 22b and 22c but is selective to the dielectric layer 16. Other process steps that may be suitable include a metal RIE plasma etch (e.g., with CO—NH3 plasma to etch copper), an ion milling (sputter) etch, or a wet etch that readily removes the metal and is also selective to the dielectric layer 16. No matter the process step selected, the result as shown in FIG. 2A is that the top surface 24 of the areas of metallization (copper or tungsten, for example) 22a, 22b and 22c is recessed between about 10 nm and 100 nm below the top surface 26 of the dielectric material 16.

After the metal has been recessed, a capping liner or barrier layer 28 of a selected material is deposited over the dielectric material 16 and the recessed metal lines of FIG. 2A. Thus, the copper (or other metal) lines are completely encased or encapsulated by liner, such as for example, Ta, TaN, Ti, TiN, SiN, or SiC as shown in FIG. 2B. In one embodiment, the encapsulating layer 28 will be chosen to be the same material used to line the trenches 18a, 18b and 18c. However, the use of the same material is not necessary, and other materials suitable for protecting the copper lines may be used.

Figure 2C:
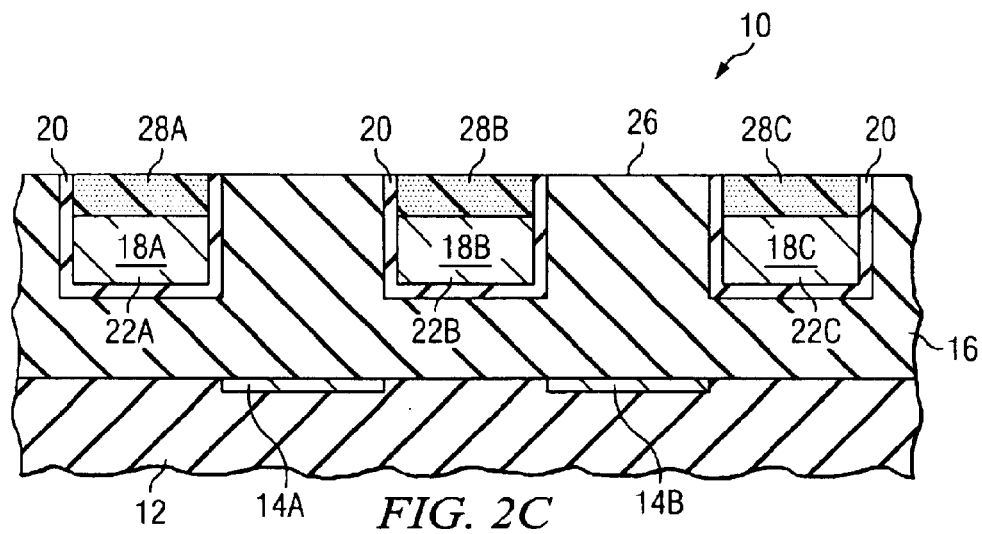

Referring now to FIG. 2C, the liner material 28 located on the dielectric layer 16 is planarized by any suitable process, such as for example, by CMP down to the top surface 26 of dielectric layer 16. This results in the areas of metallization 22a, 22b and 22c being completely encapsulated by the barrier liner 20 that lines the trenches and the capping layer or material 28a, 28b and 28c as shown in FIG. 2C. The planarization in this embodiment will also isolate the areas of metallization from neighboring areas of metallization, and provide a very smooth surface for subsequent processing steps. Alternately, the layer of barrier material 28 may be deposited with sufficient thickness that it can be polished down so that it not only encases the areas of metallization but also leaves a planarized layer of the barrier material that covers both the areas of metallization and the dielectric layer 16. As discussed below, encapsulating the areas of metallization in a suitable material provides the opportunity for additional aggressive and harsh processing steps.

Figure 2D:
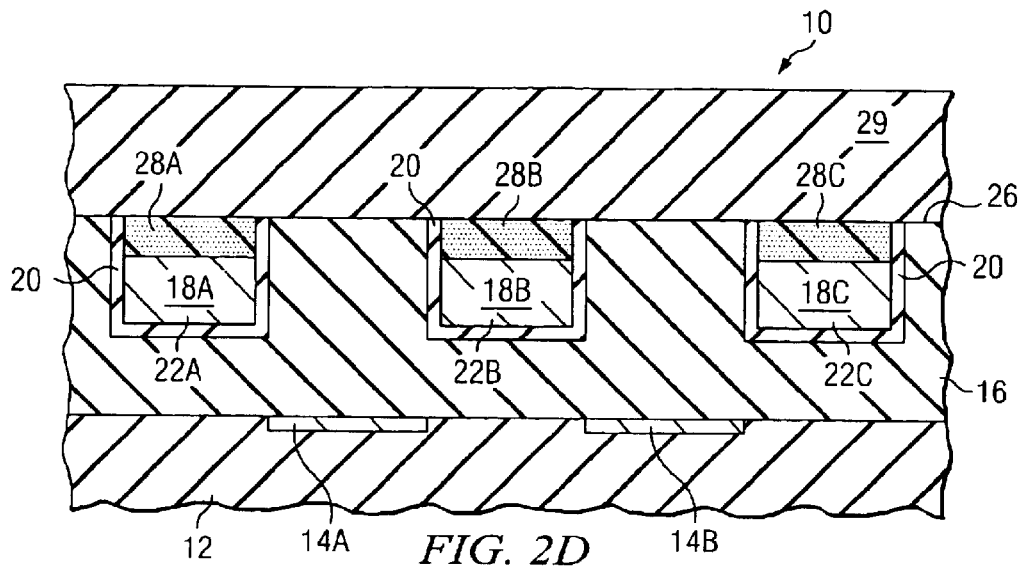

As will also be appreciated by those skilled in the art, additional layers of electronic elements of lines of metallization may be formed above the encapsulated lines or areas of metallization such as shown in FIG. 2D. For example, another dielectric layer 29 may be deposited directly on top of protective encapsulant material 28a, 28b and 28c and the dielectric layer 16. The encapsulating material 28 allows the dielectric layer 29 to be deposited directly without first forming a silicon nitride or silicon carbide layer as was typically required by prior art processes. Consequently, if silicon oxide or a low-K material is used as the dielectric layer 29 in close contact with the areas of metallization of copper and tungsten the capacitance between electronic elements and/or areas of metallization can be reduced relative to the prior art which requires a higher-K material to be used as an adhesion promoter and diffusion inhibitor.

Figure 3A:
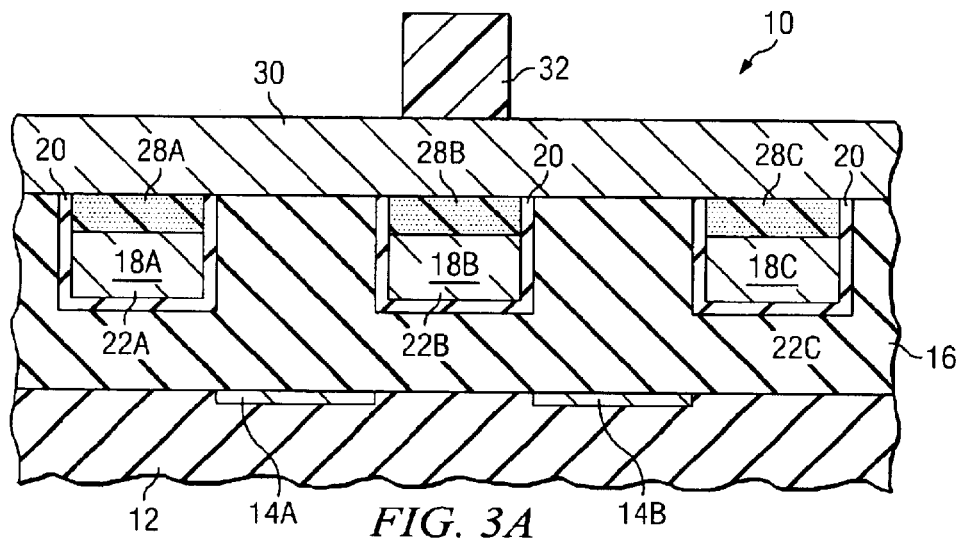
FIGS. 3A and 3B, and FIGS. 4A, 4B, 4C and 4D illustrate two embodiments of the present invention suitable for protecting areas of metallization from aggressive and harsh processing steps.
Figure 3B:
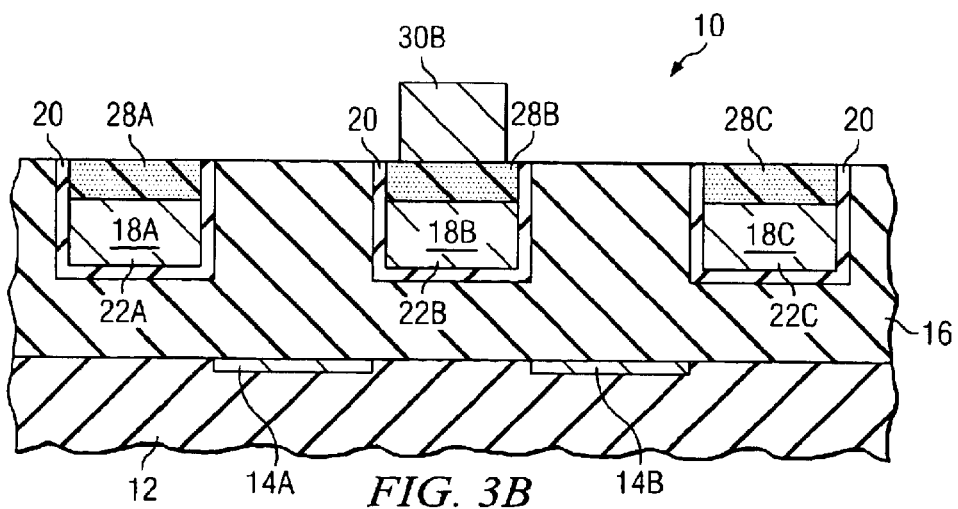

Referring now to FIGS. 3A and 3B, and 4A, 4B and 4C, there are illustrated examples of processing methods enabled by this invention. As shown in FIG. 3A, an MRAM or Magnetic Random Access Memory may be fabricated by depositing a stack 30 of magnetic films on top of the planarized structure of FIG. 2C as shown in FIG. 3A. A photoresist or alternative hard mask 32 is then deposited and patterned as also shown in FIG. 3A. As will be appreciated by those skilled in the art, to etch the magnetic stack 30, harsh or aggressive processing steps are often required. For example, because of the protective encapsulation of the areas of metallization, the magnetic stack 30 may now be etched with a chlorine-based RIE (Reactive Ion Etch). Prior art structures with unencapsulated copper (or tungsten) areas of metallization can be very difficult to reactive etch with chlorine-based chemicals since practical endpoints result in exposed copper (or tungsten) with unacceptable corrosion of the copper (or tungsten) due to the chlorine. However, according to this invention, encapsulating the copper lines with a material such as Ta, TaN, Ti, TiN, SiN, or SiC gives adequate protection for a substantial over-etch of the magnetic stack 30 without causing corrosion of the copper (or tungsten) lines. The resulting structure is shown in FIG. 3B.

Figure 4A:
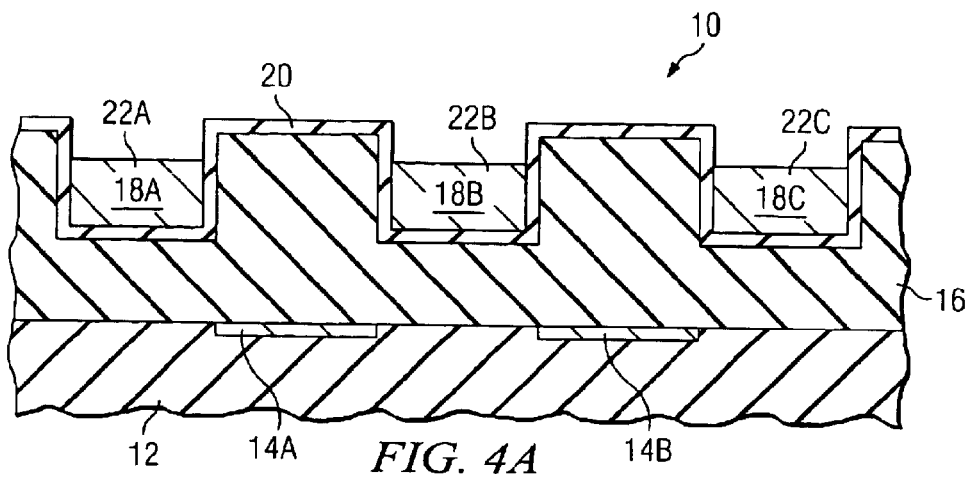
Figure 4B:
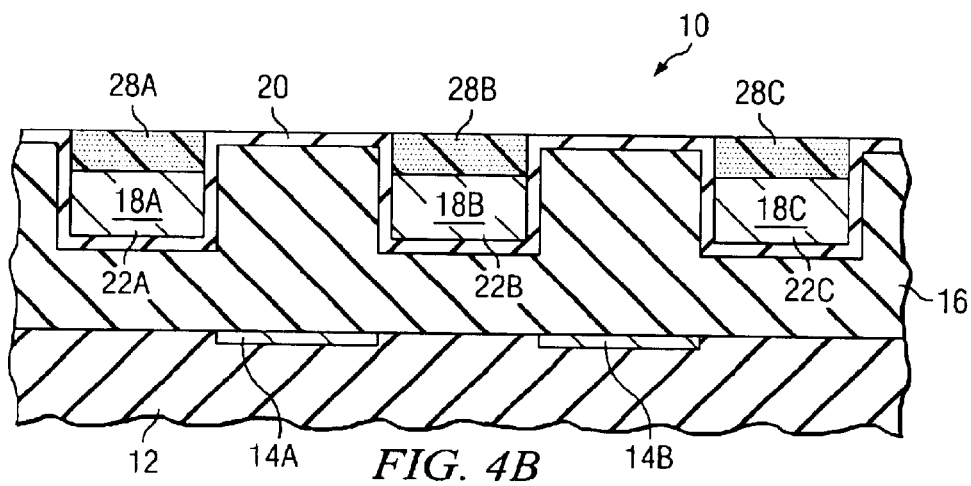
Figure 4C:
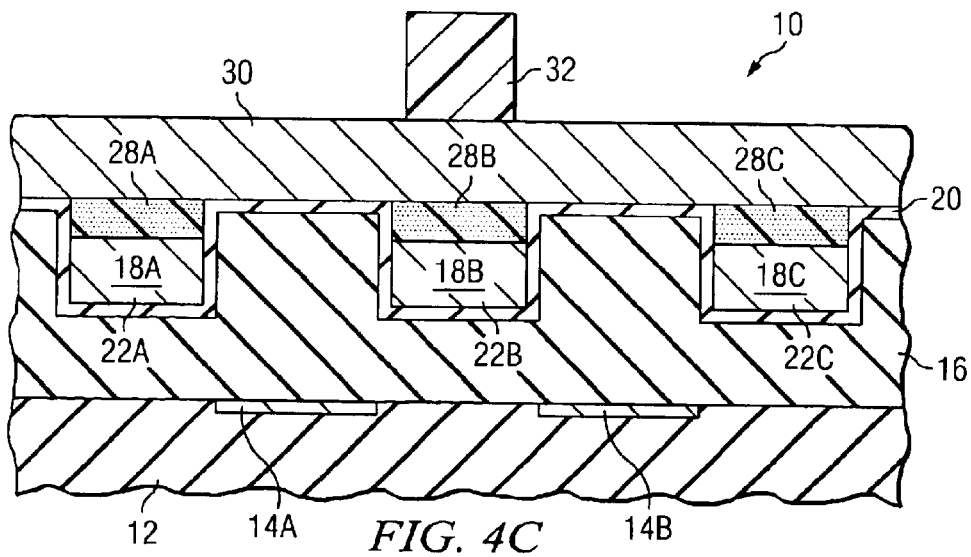
Figure 4D:
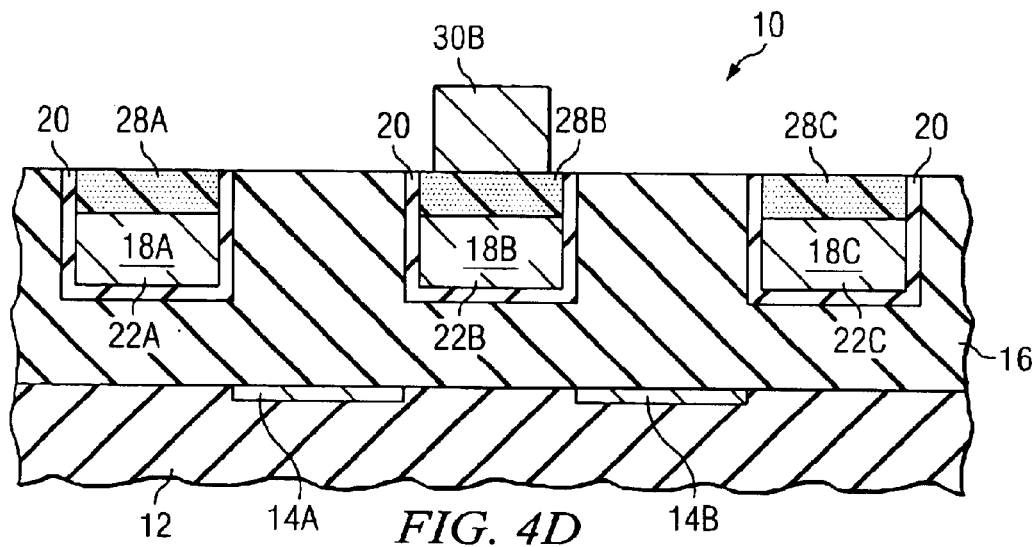

FIGS. 4A, 4B, 4C and 4D illustrate an alternate embodiment for using aggressive or harsh processing steps. According to this embodiment, the prior art processing steps discussed above will typically be followed to arrive at the structure illustrated in FIG. 1B. Then, unlike the previous embodiment, portions of the protective liner material 20 covering dielectric layer 16 are not removed as shown in FIG. 1C, but are left in place. The metal in the trench is again recessed as illustrated in FIG. 4A, according to one of the processes used as discussed above with respect to FIG. 2A. A suitable barrier or protective encapsulating material 28a, 28b and 28c, such as Ta, TaN, Ti, TiN, SiN, or SiC, is then deposited over the top surface 24 of the copper lines 22a, 22b and 22c so as to fill the recesses above the copper or tungsten lines by a process such as was discussed with respect to FIG. 2B. The barrier or liner material 28 will not only be deposited in the recesses above the copper lines, but will also be deposited over the existing liner material 20 used to line the trenches. The structure is then CMP (chemical-mechanical polished) to planarize the encapsulating material 28 as shown in FIG. 4B, with the option of polishing away the liner material 20 atop the dielectric 16. For example, according to one embodiment, 40 nm of TaN is deposited over the structure and then polished to leave a 20 nm coating. A stack 30 of magnetic films is then deposited over the planarized structure followed by a mask 32 as was discussed above and as also shown in FIG. 4C. The magnetic stack 30 can then be etched with a harsh or aggressive etching step, such as a chlorine-based RIE, to produce the structure shown in FIG. 4D.

After the patterning of the magnetic film stack 30, a layer of suitable material such as Silicon Nitride (SiN) or Silicon Oxide (SiOx), can be deposited over the patterned structure and CMP performed in a manner suitable for proceeding with still another level of metallization or circuitry. It will also be appreciated that by selecting a liner material such as Ta, TaN, Ti, TiN, SiN, or SiC, the encapsulated metal lines can be used as a hard mask during an etching step.

Figure 5A:
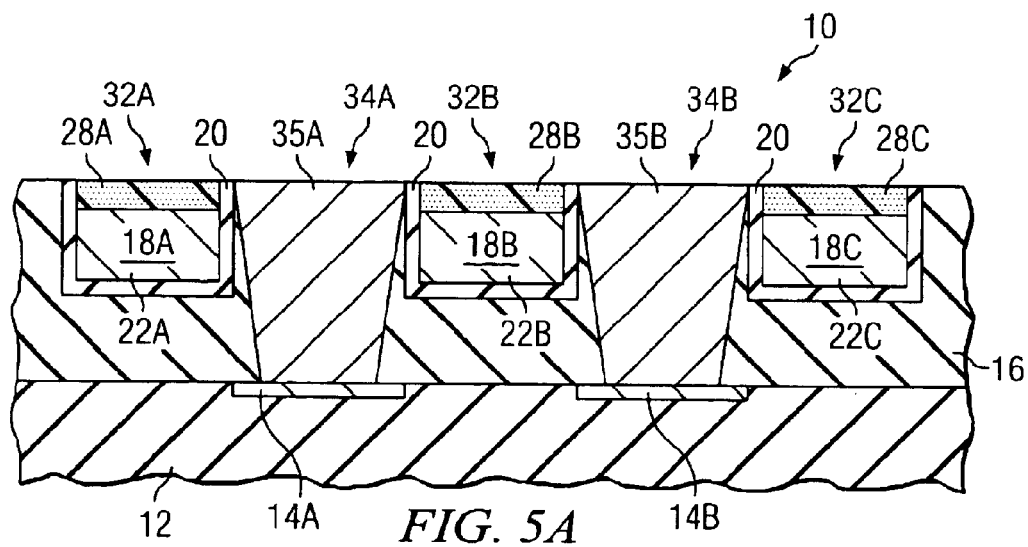
FIGS. 5A and 5B illustrate the advantages of the present invention to decrease the cell size of an electronic circuit connected to a lower layer of metallization or circuits by vias.
Figure 5B:
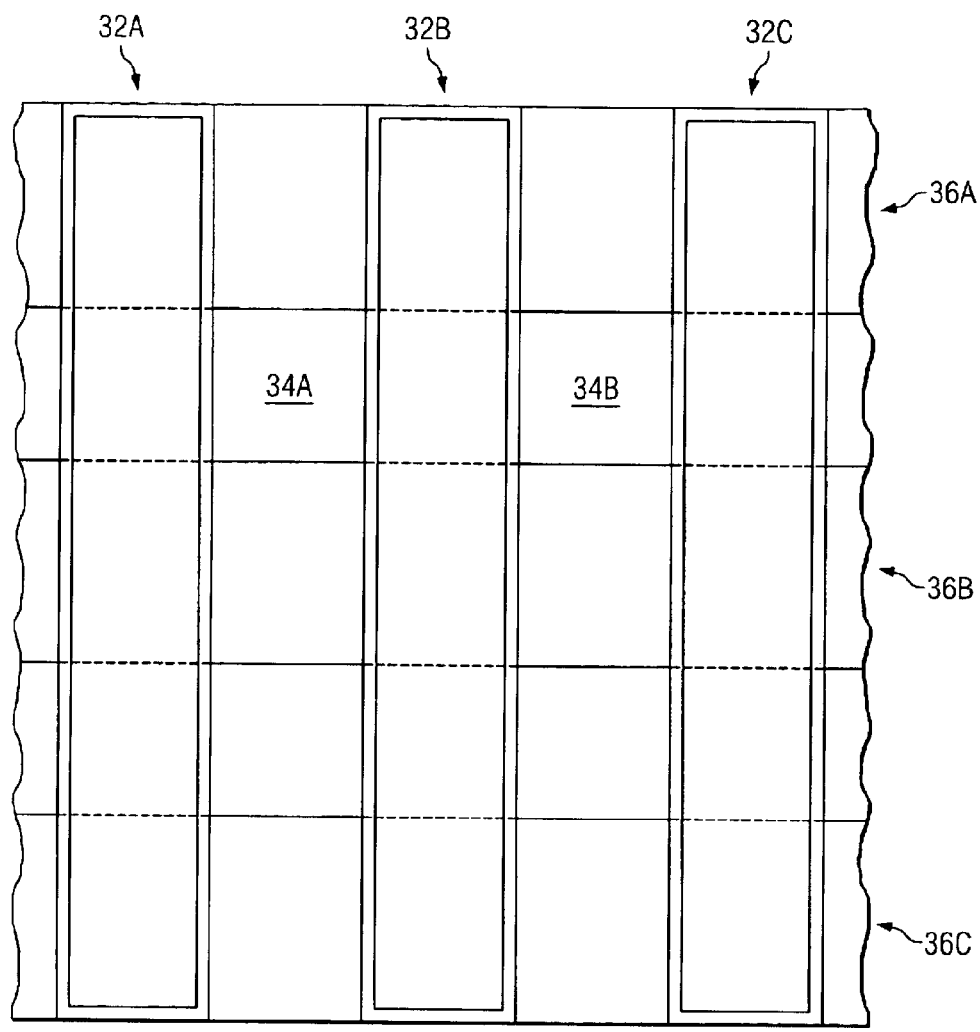

Therefore, referring now to FIG. 2C along with FIGS. 5A and 5B, there is illustrated a second advantage of the present invention. As shown, the barrier material 20 and 28 encapsulating the metal lines 22a and 22b, is suitable for use as an etch hard mask. Thus, as shown in FIG. 5A, the dielectric 16 between the encapsulated metal lines 22a and 22b may be etched away leaving self-aligned vias 34A and 34B. Also as shown, a suitable conductive metal can be used to fill vias 34A and 34B to form conductive plugs 35A and 35B that are only slightly separated from the areas of metallization 22a, 22b, and 22c by the barrier material 20 but still is not in electrical contact with these areas of metallization. This is particularly simple to implement if the liner 20 and encapsulant 28 are chosen to be dielectrics such as SiN or SiC, in which case the etched vias are naturally insulated from the adjacent metal lines 22a and 22b.

Referring now to FIG. 5B, there is shown an example of a top view of a structure that could be fabricated according to the teachings of this invention by depositing resist strips 36a, 36b and 36c located perpendicular to the areas of metallization 22a, 22b and 22c. Because vias can be precisely placed, significant space can be saved, which in turn can increase yield.

Previous processes that did not use the self-aligning mask process of the present invention typically required twice the distance between two parallel areas of metallization to minimize electrical shorts and other affects of this alignment.

It will also be appreciated that encapsulating the areas of metallization, as discussed above, will also effectively prevent the migration of metal ions, such as copper, into surrounding or adjacent sensitive electronic elements or components. The use of encapsulants such as Ta, TaN, Ti, TiN, SiN, or SiC on trenches and vias can also inhibit surface diffusion (e.g., along the sides of trenches) as seen in electromigration, and can be very beneficial as a barrier to diffusion (e.g., due to electromigration in vias).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A method of protecting an area of metallization in a semiconductor structure to enhance further processing, comprising the steps of:

providing a substrate with a dielectric layer having a top surface, said dielectric layer defining at least one area filled with metal, said metal filling said area having an exposed top surface;

recessing said exposed top surface of said metal filling said at least one area below said top surface of said dielectric layer; and depositing a layer of protective encapsulant material over said recessed top surface of said metal filling said at least one area.

2. A method of protecting an area of metallization in a semiconductor structure to enhance further processing, comprising the steps of:

providing a substrate with a dielectric layer having a top surface that defines at least one area of metallization-having an exposed top surface, recessing said exposed top surface of said at least one area of metallization-below said top surface of said dielectric layer with one of the processing steps selected from the group consisting of wet etching, reactive ion etching (RIE), ion beam etching (IBE), and modified Damascene CMP (chemical-mechanical polishing); and depositing a layer of protective encapsulant material over said recessed top surface of said at least one area of metallization.

3. The method of claim 2 wherein said step of depositing protective encapsulant comprises the step of depositing a layer of material selected from the group consisting of Tantalum, Tantalum Nitride, Titanium, Titanium Nitride, Silicon Nitride, Silicon Carbide, and combinations of such materials, over said recessed top surface of at least one area of metallization.

4. The method of claim 2 wherein said step of depositing protective encapsulant material comprises the steps of depositing a layer of said material over the top surface of said dielectric and said at least one area of metallization and removing said protective encapsulant material from said top surface of said dielectric layer.

5. The method of claim 2 wherein said step of removing protective encapsulant comprises one of CMP and etch-back processes to planarize said semiconductor structure.

6. A method of protecting an area of metallization in a semiconductor structure to enhance further processing, comprising the steps of:

providing a substrate with a dielectric layer having a top surface that defines at least one area of metallization having an exposed top surface;

recessing said exposed top surface of said at least one area of metallization below said top surface of said dielectric layer;

depositing a layer of protective encapsulant material over said recessed top surface of said at least one area of metallization depositing a stack of magnetic films over said dielectric layer and said protective encapsulant material; and pattern-etching said stack of magnetic films.

7. The method of claim 6 wherein said step of pattern etching comprises the step of etching with a chlorine-based RIE.

8. The method of claim 2 wherein said step of providing comprises the steps of providing a substrate with a dielectric layer having a top surface and defining a first cavity with a barrier liner of a selected material on said walls and bottom of said trench and said first cavity with said barrier liner being filled with a conductive material to form said at least one area of metallization.

9. The method of claim 8 further comprising the processing steps of using said layer of protective encapsulant to provide a self-aligned etch mask, etching a second cavity in said dielectric layer, said second cavity separated from said line of metallization by said protective encapsulant and said barrier liner.

10. The method of claim 9 wherein the liner material on the sides and bottom of said first cavity and SiC, and the protective encapsulant is an insulator selected from the group consisting of SiN and SiC.

11. The method of claim 10 further comprising the processing steps of filling said second cavity with a conductive material.

12. A method of protecting an area of metallization in a semiconductor structure to enhance further processing, comprising the steps of:

providing a substrate with a dielectric layer having a top surface that defines at least one area of metallization having an exposed top surface;

recessing said exposed top surface of said at least one area of metallization below said top surface of said dielectric layer; and depositing a layer of protective encapsulant material over said recessed top surface of said at least one area of metallization, said protective encapsulant of said area of metallization being selected for reducing the effects of at least one of ion migration and electromigration from the material forming said area of metallization.

13. The method of claim 2 wherein the top surface of the area of metallization is recessed between about 10 nm and 100 nm.

14. A method of protecting an area of metallization in a semiconductor structure to enhance further processing, comprising the steps of:

providing a substrate with a dielectric layer having a top surface that defines at least one area of metallization selected from the group consisting of copper and tungsten having an exposed top surface;

recessing said exposed top surface of said at least one area of metallization below said top surface of said dielectric layer; and depositing a layer of protective encapsulant material over said recessed top surface of said at least one area of metallization.

15. The method of claim 8 wherein said barrier liner is selected from the group consisting of Tantalum, Tantalum Nitride, Titanium, Titanium Nitride, Silicon Nitride, Silicon Carbide, and combinations of said materials.

16. A method of protecting an area of metallization in a semiconductor structure to enhance further processing, comprising the steps of:

providing a substrate with a dielectric layer having a top surface that defines at least one area of metallization having an exposed top surface;

recessing said exposed top surface of said at least one area of metallization below said top surface of said dielectric layer;

depositing a layer of protective encapsulant material over said recessed top surface of said at least one area of metallization; and depositing a dielectric layer directly on top of the protective encapsulant material and said top surface of said dielectric material.

17. The method of claim 16 wherein the material forming said at least one area of metallization is selected from the group consisting of copper or tungsten, and said deposited dielectric film is a material selected from the group consisting of silicon oxide and a low-K dielectric.

18. The method of claim 16 wherein said protective encapsulant cooperates with said deposited dielectric film so as to reduce the capacitance of newly-formed devices.

19. The method of claim 18 and further including other areas of metallization above said layer of protective encapsulating material.

20. The method of claim 18 wherein said other areas of metallization are protectively encapsulated.

21. A semiconductor structure including at least one area of metallization, said structure being suitable for further processing comprising:

a substrate with a dielectric layer having a top surface;

at least one area of defined in said dielectric layer filled with metal, said metal filling said area having a top surface recessed below said top surface of said dielectric layer; and a layer of protective encapsulant material covering said top surface of said metal filling said at least one area and at least partially filling said recess.

22. The semiconductor structure of claim 21 wherein said layer of protective encapsulant material is selected from the group consisting of Tantalum, Tantalum Nitride, Titanium, Titanium Nitride, Silicon Nitride and Silicon Carbide.

23. The semiconductor structure of claim 21 wherein said metal filling said at least one area is selected from the group consisting of copper and tungsten.

24. The semiconductor structure of claim 21 further comprising a barrier liner between said dielectric layer and said area filled with metal.

25. The semiconductor structure of claim 24 wherein said barrier liner between said dielectric layer and said at least one area of metallization is selected from the group consisting of Tantalum, Tantalum Nitride, Titanium, Titanium Nitride, Silicon Nitride and Silicon Carbide.

26. The semiconductor structure of claim 25 further comprising one or more etched stacks of magnetic films located on said top surface of said layer of protective encapsulant material and said top surface of said dielectric layer according to a selected pattern.

27. The semiconductor structure of claim 22 further comprising one or more etched stacks of magnetic film located on said top surface of said layer of protective encapsulating material and said top surface of said dielectric layer according to a selected pattern.

28. The semiconductor structure of claim 25 wherein said at least one area filled with metal comprises at least two adjacent lines of metal in said layer of dielectric and covered by said protective encapsulant material and wherein said layer of dielectric further defines a cavity etched in said dielectric layer between said two adjacent lines of metal.

29. The semiconductor structure of claim 24 wherein said layer of protective encapsulant material covering said at least one area filled with metal and said barrier liner between said dielectric layer and said at last one area filled with metal are made of a material selected for reducing ion migration from said at least one line of metallization.

30. The semiconductor structure of claim 29 wherein said metal filling said at least one area is a material selected from the group consisting of copper and tungsten.

31. The semiconductor structure of claim 21 wherein said top surface of said at least one area of metallization is recessed between about 10 nm and 100 nm below said top surface of said dielectric layer.

32. The semiconductor structure of claim 21 wherein said layer of protective encapsulant material is a planarized layer.

* * * * *